United States Patent [19]

Kasatani

[11] Patent Number: 5,306,541
[45] Date of Patent: Apr. 26, 1994

[54] PRINTED CIRCUIT BOARD AND TERMINAL BOARD WITH STAGGERED CONDUCTIVE PADS

[75] Inventor: Yasushi Kasatani, Itami, Japan

[73] Assignee: Mitsubishi Denki Kabushiki Kaisha, Tokyo, Japan

[21] Appl. No.: 5,865

[22] Filed: Jan. 15, 1993

Related U.S. Application Data

[63] Continuation of Ser. No. 492,854, Mar. 13, 1990, abandoned.

[51] Int. Cl.⁵ ............................................. B32B 23/02
[52] U.S. Cl. .................................. 428/192; 428/195; 428/209; 428/210; 428/457; 428/901
[58] Field of Search ............... 428/192, 195, 209, 210, 428/457, 901

[56] References Cited

PUBLICATIONS

Draper, C. R., *Printed Circuits and Electronics Assemblies*, 1969, p. 262.

Primary Examiner—Patrick J. Ryan
Assistant Examiner—Elizabeth Evans
Attorney, Agent, or Firm—Leydig, Voit & mayer

[57] ABSTRACT

A printed circuit board has a staggered array of mounting pads on a surface thereof for supporting a terminal board. A solder material is provided on the staggered array and then a terminal board having a corresponding array of pads is placed on the printed circuit board. The solder material is heated and then cooled, whereby the terminal board is fixed to the printed circuit board without causing an electric short between pads.

9 Claims, 7 Drawing Sheets

PRINTED CIRCUIT BOARD AND TERMINAL BOARD WITH STAGGERED CONDUCTIVE PADS

This application is a continuation of application Ser. No. 07/492,854, filed Mar. 13, 1990, now abandoned.

BACKGROUND OF THE INVENTION

1. Field of the Invention

The present invention relates to a printed circuit board and a method of mounting a terminal board thereon, and more particularly to an improvement in the positional arrangement of mounting pads on the printed circuit board.

2. Description of the Related Art

FIG. 1 illustrates a conventional printed board 1 which is fabricated for obtaining an integrated circuit card, where only a part of the circuit structure is shown. The printed circuit board 1 has an insulating plate 2 on which printed wiring 4 is provided. Regions 3 for accepting integrated circuit devices and discrete electronic elements are defined on the insulating plate 2. On the connector portion 5 of the printed circuit board 1, an exposed linear array of mounting pads 6 is formed along an edge 7 of the printed circuit board 1. The mounting pads 6 are made of a metal or an alloy and are electrically connected to the printed wiring 4.

FIG. 2A illustrates the bottom surface 10B of a terminal board 10 which is to be mounted on the printed circuit board 1, while FIG. 2B illustrates the top surface 10T of the terminal board 10. A linear array of mounting pads 11 is provided on the bottom surface 10B along an edge 13 of the board 10, and the mounting pads 11 are electrically connected to corresponding terminal pads 12 formed on the top surface 10F of the board 10.

FIG. 3 is a perspective view showing a process of mounting the terminal board 10 on the printed circuit board 1. As illustrated in detail in FIG. 4, a solder pattern layer 14 is formed on the mounting pads 6 by means of a solder printing device, and then the terminal board 10 is placed on the printed circuit board 1 (FIG. 3) so that the solder pattern layer 14 is sandwiched between the mounting pads 6 and 11, the mounting pads 11 not being shown in FIG. 3. The overlapped region of the printed circuit board 1 and the terminal board 10 is heated to melt the solder pattern layer 14. The overlapped region is then cooled, so that the terminal board 10 is fixed to the printed circuit board 1, and the mounting pads 6 and 11 are electrically connected to each other.

A module 20 thus obtained is packaged together with a battery, whereby an integrated circuit card (IC card) is obtained. Electronic communication between the IC card and and IC card reader (not shown) is attained by inserting the IC card into the IC card reader, so that the terminal pads 12 are electrically in contact with terminal electrodes provided in the IC card reader. The terminal board 10 is effective in electrically connecting the printed circuit board 1 to the terminal electrodes of the IC card reader because the terminal electrodes of the IC card reader are located at a position which is somewhat higher than the mounting pads 6 of the printed circuit board 1 when the IC card is inserted into the IC card reader.

In the above-described mounting process, the solder material of the solder pattern layer 14 spreads from the mounting pads 6 over the peripheral areas thereof, because the solder material is melted and pushed between the printed circuit board 1 and the terminal board 10. Accordingly, if the respective array pitches of the mounting pads 6 and 11 are relatively small, the solder material spreading from one pad often reaches a neighbouring pad, so that these mounting pads are electrically shorted.

SUMMARY OF THE INVENTION

According to the present invention, a printed circuit board comprises (a) an insulating plate; (b) a staggered planar array of conductive pads formed on an end portion of the insulating plate; and (d) printed wiring formed in the insulating plate and electrically connected to the conductive pads.

Each of the conductive pads may have a width smaller than the array pitch of the staggered array in a first direction in which the conductive pads are arrayed.

The present invention is also directed to a terminal board which is to be mounted on a printed circuit board. According to the present invention, the terminal board comprises (a) an insulating plate having a top surface and a bottom surface; (b) a linear array of first conductive pads provided on the top surface; and (c) a staggered planar array of second conductive pads provided on the bottom surface and electrically connected to corresponding ones of the first conductive pads.

In an aspect of the present invention, a terminal board is mounted on a printed circuit board through the steps of (a) preparing a printed circuit board having a first staggered array of first conductive pads on a first insulating plate, the first conductive pads being electrically connected to printed wiring provided on the first insulating plate; (b) preparing a terminal board having a second staggered array of second conductive pads formed on a first surface of a second insulating plate, the second conductive pads being electrically connected to a linear array of third conductive pads formed on a second surface of the second insulating plate; (c) providing a solder material on at least one of the first and second staggered arrays; (d) placing the terminal board on the printed circuit board so that the solder material is sandwiched between the first and second staggered arrays; (e) heating the solder material together with the first and second staggered arrays to melt the solder material; and (f) cooling the solder material, whereby the terminal board is fixed to the printed circuit board.

Accordingly, an object of the present invention is to provide a printed circuit board in which mounting pads are hardly shorted.

Another object of the present invention is to provide a method of mounting a terminal board on a printed circuit board without causing an electric short.

These and other objects, features, aspects and advantages of the present invention will become more apparent from the following detailed description of the present invention when considered in conjunction with the accompanying drawings.

DESCRIPTION OF PREFERRED EMBODIMENTS

Figure 1:
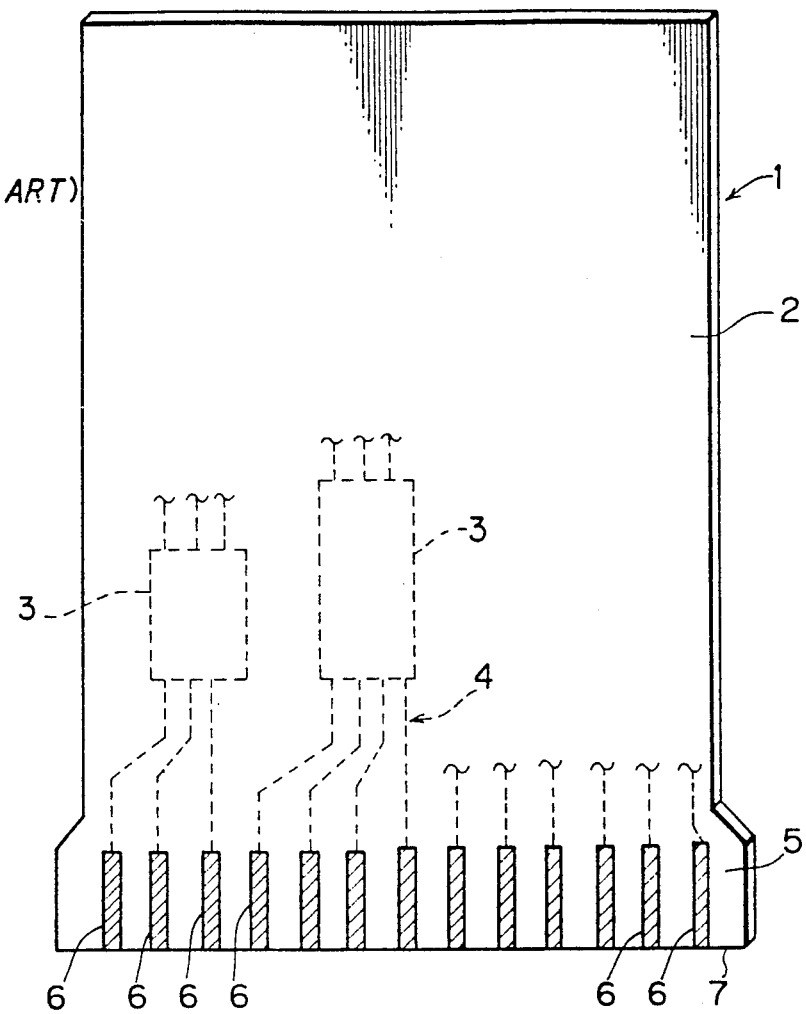
FIG. 1 illustrates a conventional printed circuit board.
Figure 2A:
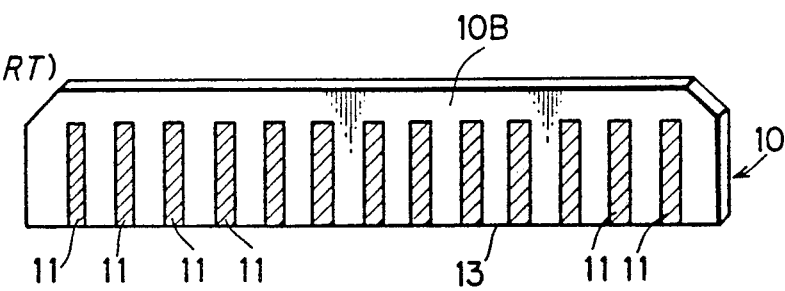
FIGS. 2A and 2B illustrate the bottom and top surfaces of a conventional terminal board, respectively.
Figure 2B:
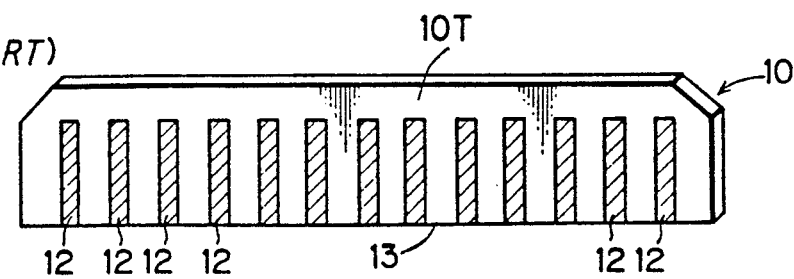
Figure 3:
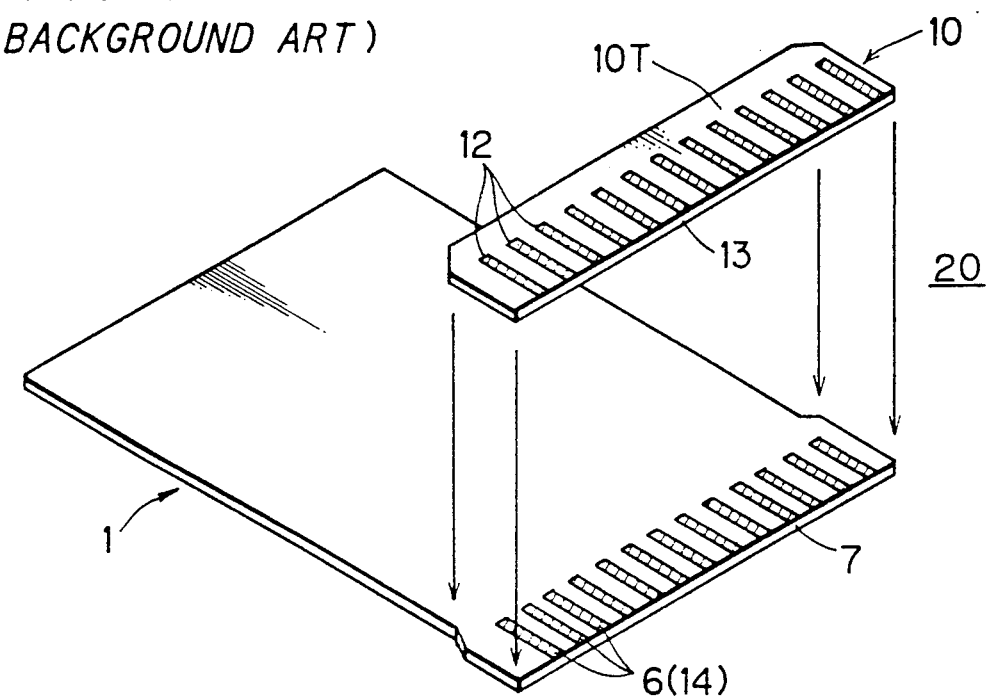
FIG. 3 is a perspective view showing a process of mounting the terminal board on the conventional printed board.
Figure 4:
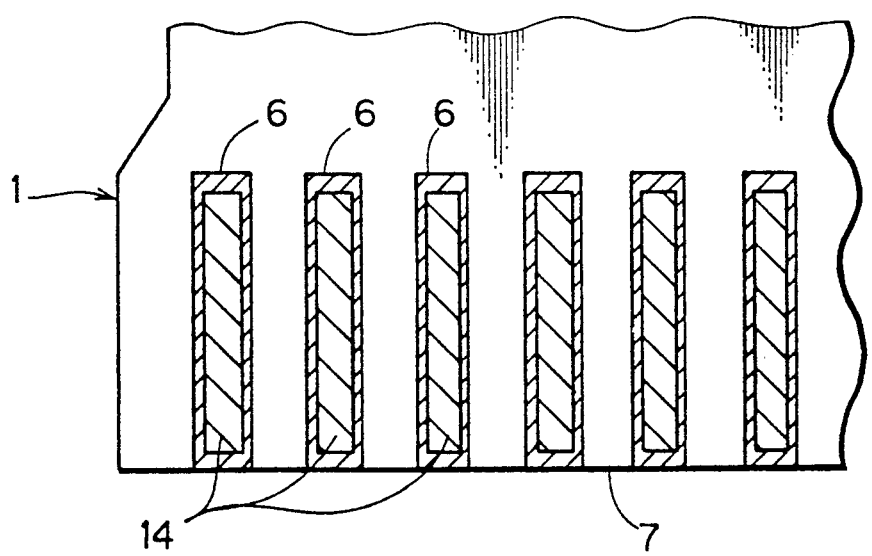
FIG. 4 illustrates a solder pattern layer on mounting pads.
Figure 5:
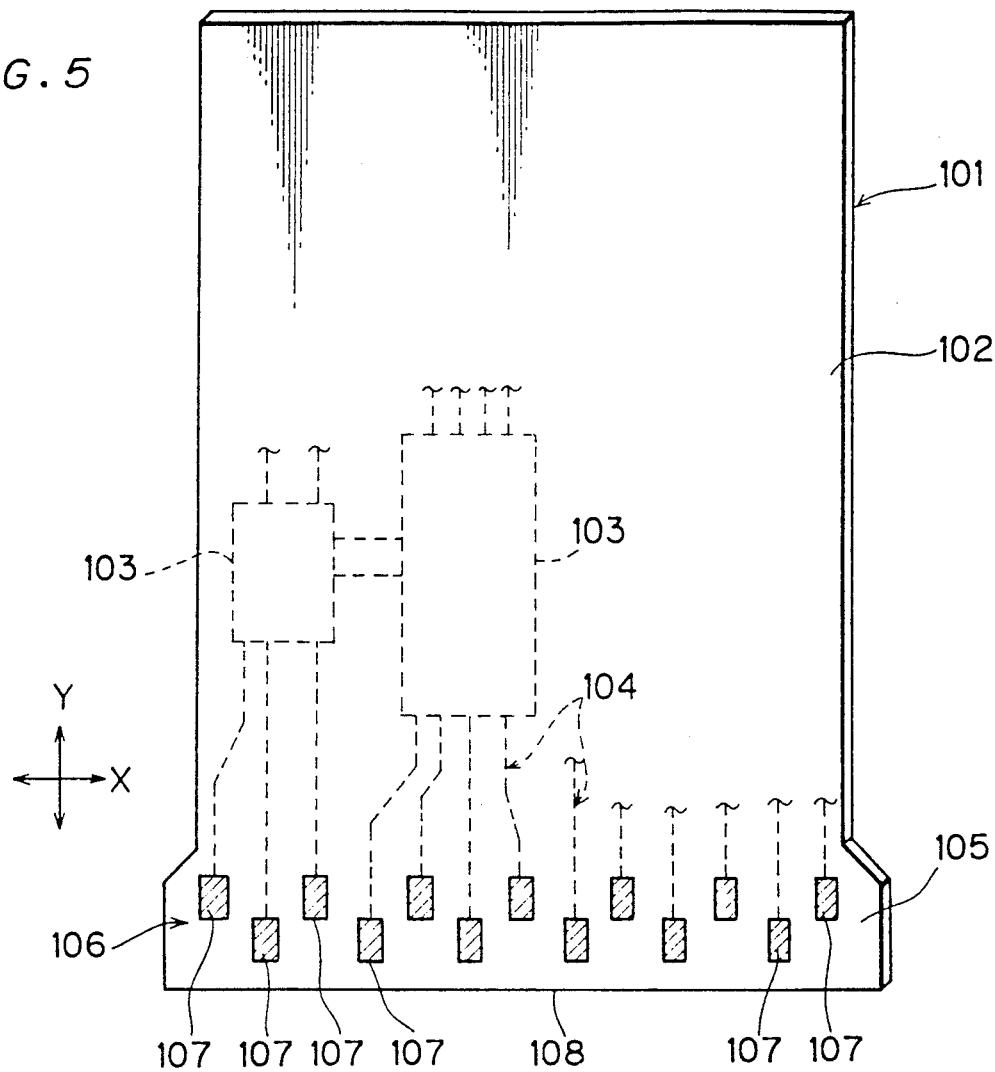
FIG. 5 illustrates a printed circuit board according to a preferred embodiment of the present invention.

FIG. 5 shows a printed circuit board 101 according to a preferred embodiment of the present invention, where only a part of the circuit structure is schematically illustrated. The printed circuit board 101 is fabricated for obtaining a printed circuit module such as an IC card and comprises an insulating plate 102 having a flat surface on which printed wiring 104 is formed. Regions 103 are defined for accepting thereon integrated circuit devices and discrete electronic elements. The integrated circuit devices to be mounted on the regions 103 may include electronic elements such as transistors and capacitors forming a memory circuit, a processing circuit and the like. The printed circuit board 101 has a connector portion 105 on which a staggered planar array 106 of mounting pads 107 are formed. The mounting pads 107 are made of a conductive material such as a metal and an alloy and each of the pads 107 has the shape of a rectangle. The mounting pads 107 are exposed and arranged on an end portion of the insulating plate 102 along an edge 108 of the insulating plate 102. The respective positions of the pads 107 are staggered or altered in the direction Y perpendicular to the direction X of the edge 108. The mounting pads 107 are electrically connected to the printed wiring 104. The mounting pads 107 may be obtained through a metal printing process.

Figure 7:
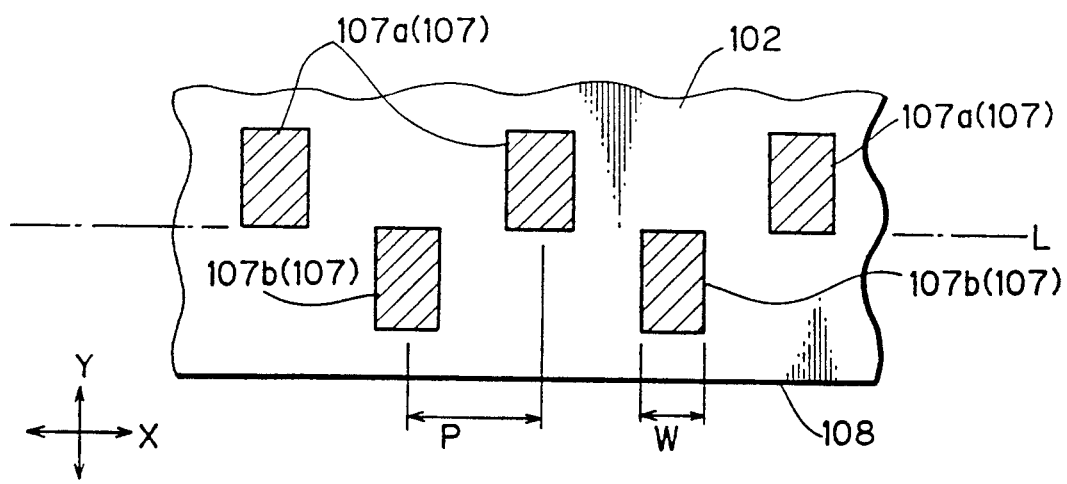
FIG. 7 illustrates the array of mounting pads on the printed circuit board shown in FIG. 5.

As illustrated in FIG. 7 in the form of an enlarged partial view, the pads 107 are classified into a first row of pads 107a aligned on one side of an imaginary line L and a second row of pads 107b aligned on the other side of the line L, where the line L is parallel to the direction X. The width W of each pad 107 in the direction X is smaller than the array pitch P of the pads 107.

Figure 6A:
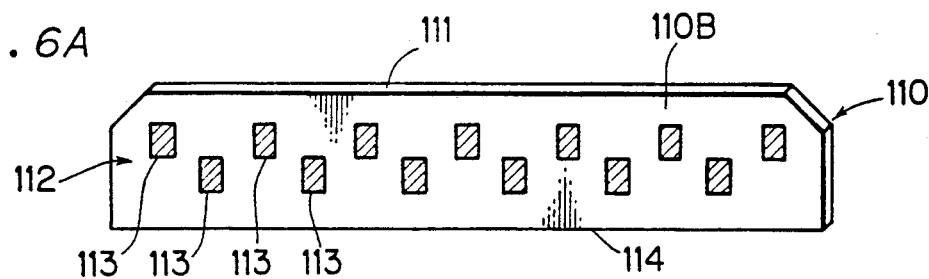
FIGS. 6A and 6B respectively illustrate the bottom and top surfaces of a terminal board which is to be mounted on the printed circuit board shown in FIG. 5.
Figure 6B:
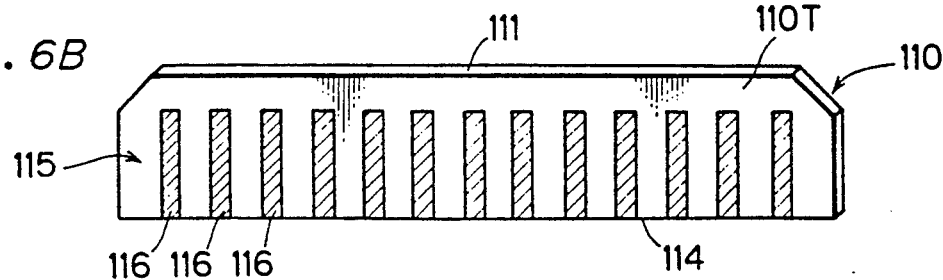
Figure 6C:
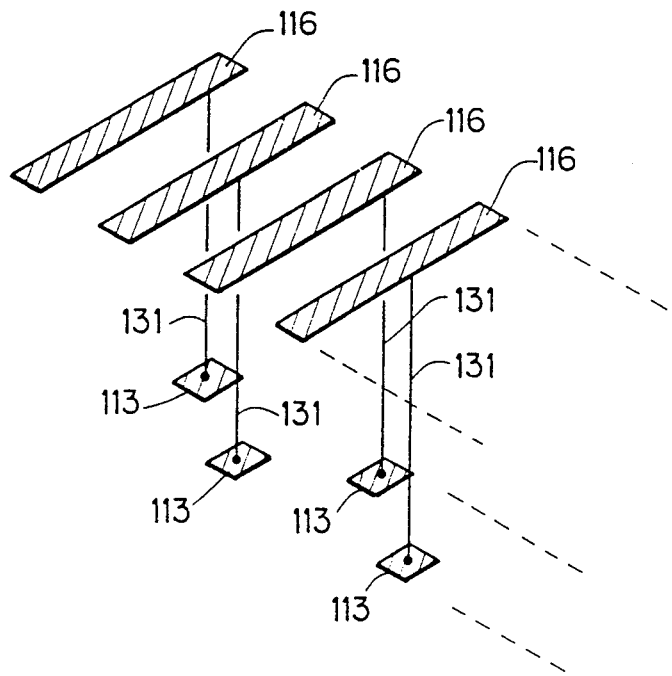
FIG. 6C illustrates an electric connection between mounting pads and terminal pads on the terminal board.

FIG. 6A illustrates the bottom or internal surface 110B of a terminal board 110 which is to be mounted on the printed circuit board 101, while FIG. 6B illustrates the top or external surface 110T of the terminal board 110. The terminal board 110 has an insulating plate 111. A stagged planar array 112 of mounting pads 113 is formed on the bottom surface 110B along an edge 114 of the insulating plate 111. The mounting pads 113 are made of a conductive material. The size and arrangement of the mounting pads 113 are identical to those of the pads 107 on the printed circuit board 101. On the other hand, a linear array 115 of terminal pads 116 is formed on the top surface 110T along the edge 114. The terminal pads 116 are made of a conductive material and the pitch thereof is identical to that of the mounting pads 113 on the bottom surface 110B. The mounting pads 113 and terminal pads 116 may be obtained through a metal printing processes. The terminal pads 116 are electrically connected to corresponding mounting pads 113 across the insulating plate 114, as schematically illustrated in FIG. 6C, with electric wiring 131. The electric wiring 131 may be conductive members which are provided between the top surface 110T and the bottom surface 110B across the insulating plate 114, for example.

Figure 8:
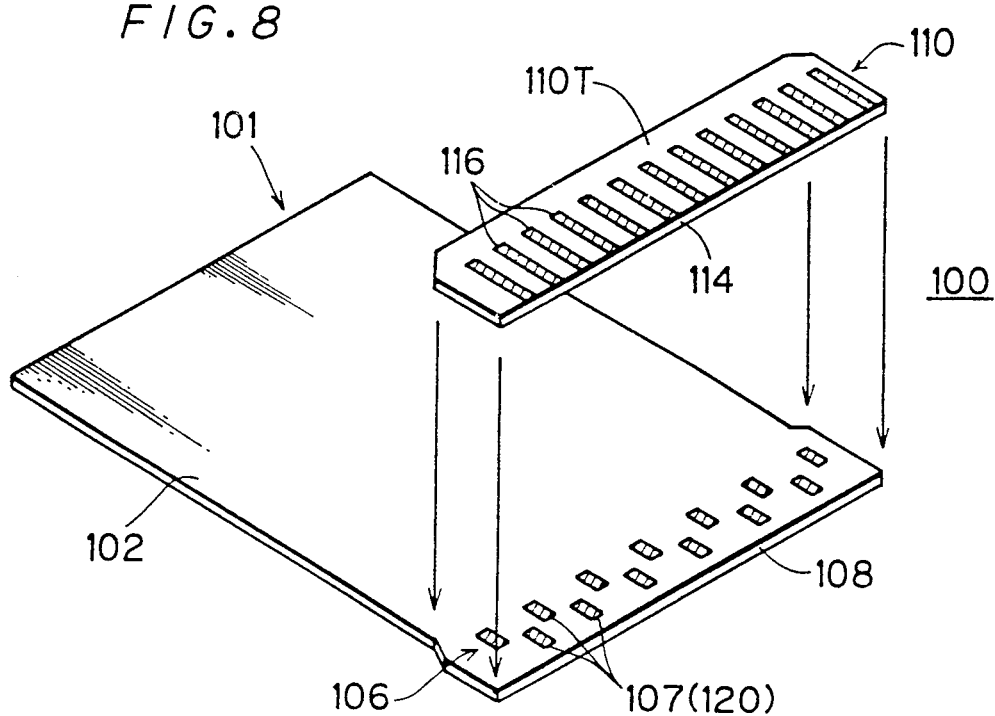
FIG. 8 illustrates a method of mounting the terminal board on the printed circuit board according to a preferred embodiment of the present invention.
Figure 9:
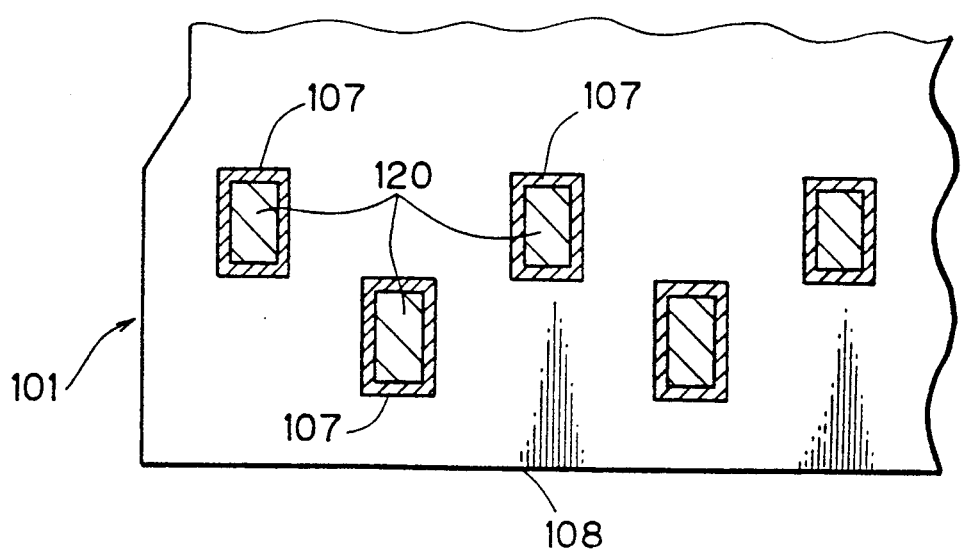
FIG. 9 illustrates a solder pattern layer on the mounting pads.

A process of mounting the terminal board 110 on the printed circuit board 101 is illustrated in FIG. 8A. As also illustrated in FIG. 9, a solder pattern layer 120 is formed on the mounting pads 107 by means of a solder printing device. The solder pattern layer 120 may be formed on the mounting pads 113 on the terminal board 110 in place of or in addition to the pads 107 of the printed circuit board 101.

Then, the terminal board 110 is placed on the printed circuit board 101 so that the solder pattern layer 120 is sandwiched between the mounting pads 107 and 113. This process step is shown in FIG. 8A, in which the mounting pads 113 are not illustrated since they are located on the bottom surface of the terminal board 110. The overlapped region of the printed circuit board 101 and the terminal board 110 is heated by a heating device so that the solder material of the solder pattern layer 120 is melted.

The overlapped region is then cooled, whereby the solder material is hardened or soldified and the terminal board 110 is fixed to the printed circuit board 101. The mounting pads 107 on the printed circuit board 101 are electrically connected to the pads 113 on the terminal board 110 through the solder pattern layer 120. Integrated circuit devices and discrete electronic elements may be mounted on the regions 103 (FIG. 5) in parallel with or before the process of mounting the terminal board 110 on the printed circuit board 101. A module 100 thus obtained is packaged together with a battery, whereby an IC card is obtained. The IC card is used such that the terminal pads 116 are electrically in contact with the terminal electrodes of an IC card reader.

In this mounting process, the solder material may spread from the pads 107 over the peripheral areas thereof. However, the spread solder material does not reach other mounting pads since the mounting pads 107 are staggered in position in the array 106 and the distance between neighbouring pads 107 is relatively large as compared with a conventional printed circuit board. As a result, the pads 107 are hardly shorted in the array 106. Similarly, the pads 113 on the terminal board 110 are hardly shorted since the pads 113 are also staggered in position.

Figure 10A:
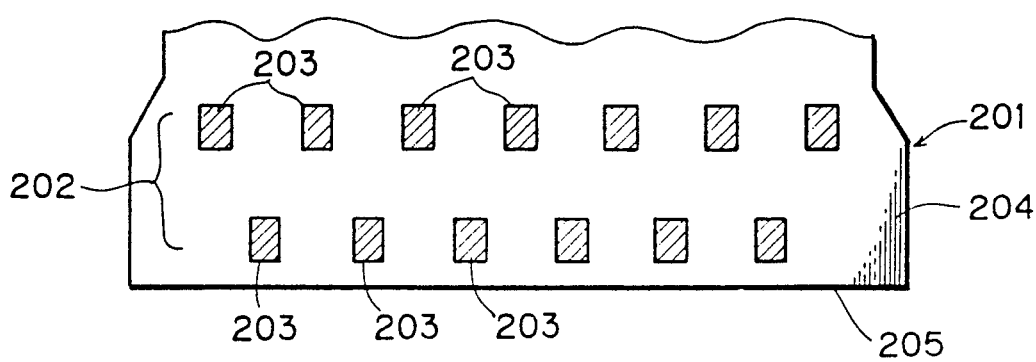
FIGS. 10A and 10B are partial plan views of a printed circuit board according to another preferred embodiment of the present invention.
Figure 10B:
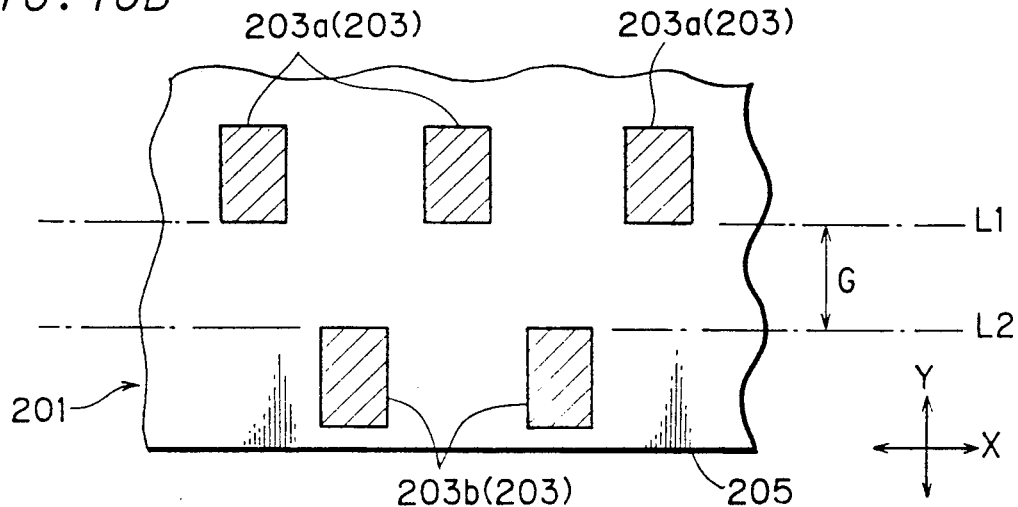
Figure 11A:
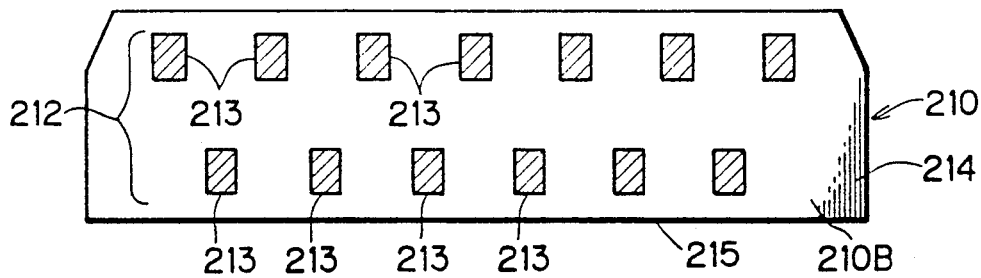
FIGS. 11A and 11B illustrate the bottom and top surfaces of a terminal board which is to be mounted on the printed circuit board shown in FIGS. 10A and 11B.
Figure 11B:
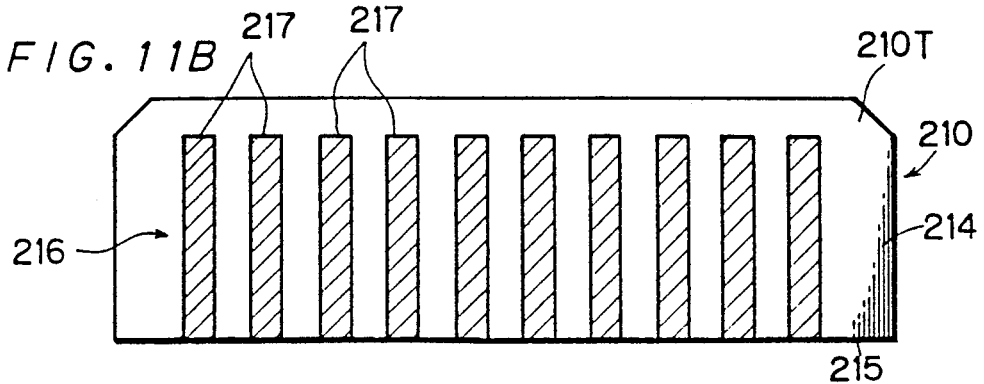

FIGS. 10A and 10B illustrate the connector portion of a printed circuit board 201 according to another preferred embodiment of the present invention. A staggered planar array 202 of mounting pads 203 is formed on an insulating plate 204 along an edge 205 thereof. As shown in FIG. 10B, the pads 203 are classified into a first row of pads 203a aligned along an imaginary line L1 and a second row of pads 203b aligned along another imaginary line L2. The lines L1 and L2 are parallel to the direction X. There is a finite gap G between the first row of pads 203a and the second row of pads 203b in the direction Y. Correspondingly, a terminal board 210 shown in FIGS. 11A and 11B is provided with a staggered planar array 212 of mounting pads 213 on the bottom surface 210B of an insulating plate 214. The mounting pads 213 are arrayed along an edge 215 of the insulating plate 214, and the arrangement of the pads 213 is identical to that of the pads 203 on the printed circuit board 201. The top surface 210T (FIG. 11B) is provided thereon with a linear array 216 of terminal pads 217. The structure of the printed boards 201 and the terminal board 210 is otherwise substantially the same as that shown in FIGS. 5, 6A and 6B.

Since the mounting pads 203 are staggered across the gap G in the direction Y, isolation of each pad 203 is further improved and the pads 203 are hardly shorted by a solder material which is used for mounting the terminal board 210 on the printed board 201.

Figure 12:
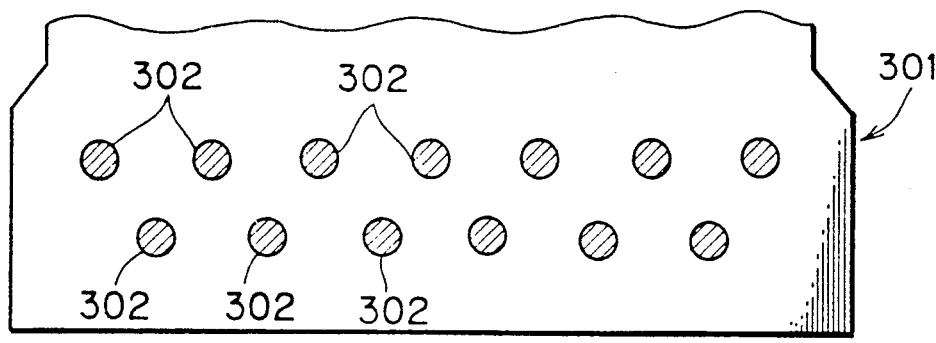
FIG. 12 is a partial plan view of a printed circuit board according to another preferred embodiment of the present invention.
Figure 13A:
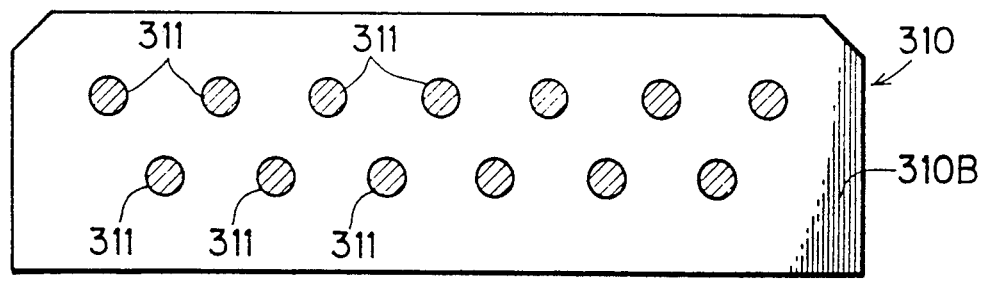
FIGS. 13A and 13B illustrate the bottom and top surfaces of a terminal board which is to be mounted on the printed circuit board shown in FIG. 12.
Figure 13B:
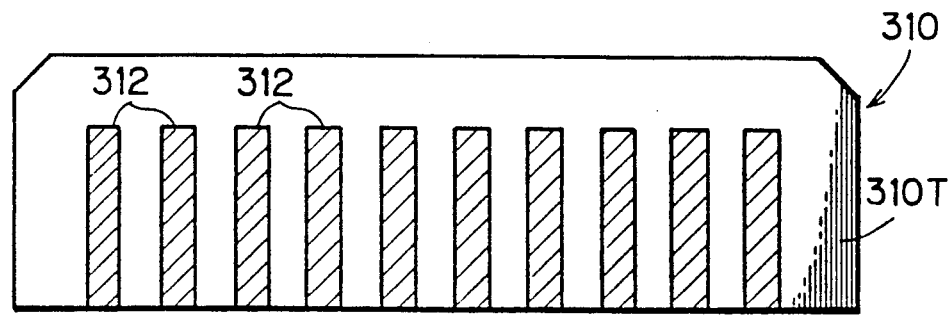

In the present invention, the shapes of mounting pads may be arbitrarily selected. FIG. 12 illustrates a modification of the mounting pads in which a staggered array of circular pads 302 is provided on a printed circuit boards 301. Correspondingly, a terminal board 310 shown in FIGS. 13A and 13B has a staggered planar array of circular pads 311 on the bottom surface 310B thereof, while a linear array of terminal pads 312 is provided on the top surface 310T. Other shapes may be employed for mounting pads in place of rectangles or circles.

I claim:

1. A printed circuit board comprising:
   an insulating plate having a surface for supporting a terminal board, said surface including an end;
   a staggered planar array of conductive pads disposed /n said surface of said insulating plate at said end portion of said surface; and
   printed wiring disposed on said surface of said insulating plate and electrically connected to said conductive pads.

2. The printed circuit board of claim 1 wherein each of said conductive pads has a width smaller than an array pitch of said staggered array in a first direction in which said conductive pads are arrayed.

3. The printed circuit board of claim 2 wherein said staggered array comprises a first row of pads extending in said first direction and a second row of pads also extending in said first direction.

4. The printed circuit board of claim 3 wherein said first and second rows of conductive pads are spaced from each other in said second direction by a gap.

5. A terminal board for mounting on a printed circuit board comprising:
   an insulating plate having a top surface and a bottom surface;
   a linear array of first conductive pads disposed on said top surface; and
   a staggered planar array of second conductive pads disposed on said bottom surface, each of said second conductive pads being electrically connected to a corresponding first conductive pad.

6. A printed circuit module comprising:
   a circuit board including a first insulating plate having a first surface and an end portion, a staggered planar array of first conductive pads disposed on the first surface adjoining the end portion, and printed wiring disposed on the first surface and electrically connected to the first conductive pads; and
   a terminal board mounted on the end portion of the first surface of the first insulating plate and including a second insulating plate having inner and outer opposite surfaces, a staggered planar array of second conductive pads disposed on the inner surface of the second insulating plate, and a linear array of third conductive pads disposed on the outer surface of the second insulating plate and electrically connected to the second conductive pads through the second insulating plate, the internal surface of the second insulating plate facing the first surface of the first insulating plate and the second conductive pads electrically contacting the first conductive pads.

7. The printed circuit module of claim 6 wherein the array of the first conductive pads comprises first and second rows separated by an imaginary line extending in a widthwise direction of the first insulating plate, the conductive pads in the first row being staggered with respect to the conductive pads in the second row.

8. The printed circuit module of claim 7 wherein the first conductive pads are disposed at a pitch P in the widthwise direction of the first insulating plate and each of the first conductive pads has a width W smaller than the pitch P.

9. The printed circuit module of claim 6 wherein respective first and second conductive pads are electrically connected by solder.

* * * * *

UNITED STATES PATENT AND TRADEMARK OFFICE
CERTIFICATE OF CORRECTION

PATENT NO. : 5,306,541
DATED : April 26, 1994
INVENTOR(S) : Yasushi KASATANI

It is certified that error appears in the above-indentified patent and that said Letters Patent is hereby corrected as shown below:

column 5, line 40, change "/n" to --on--.

Signed and Sealed this

Second Day of August, 1994

Attest:

BRUCE LEHMAN

Attesting Officer

Commissioner of Patents and Trademarks